(12) United States Patent
Yoon et al.

(10) Patent No.: US 10,437,749 B2
(45) Date of Patent: Oct. 8, 2019

(54) ELECTRONIC DEVICE AND METHOD OF DRIVING THE SAME

(71) Applicant: SK hynix Inc., Icheon-si, Gyeonggi-do (KR)

(72) Inventors: Jung-Hyuk Yoon, Icheon-si (KR); Ho-Seok Em, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 327 days.

(21) Appl. No.: 15/156,566

(22) Filed: May 17, 2016

(65) Prior Publication Data

US 2017/0177515 A1    Jun. 22, 2017

(30) Foreign Application Priority Data

Dec. 21, 2015    (KR) .................. 10-2015-0182846

(51) Int. Cl.
| | |
|---|---|
| G06F 13/16 | (2006.01) |
| G06F 12/0875 | (2016.01) |
| G11C 5/14 | (2006.01) |
| G11C 7/22 | (2006.01) |
| G11C 11/16 | (2006.01) |
| G11C 11/22 | (2006.01) |
| G11C 13/00 | (2006.01) |

(Continued)

(52) U.S. Cl.
CPC ...... *G06F 13/1673* (2013.01); *G06F 12/0875* (2013.01); *G06F 13/4282* (2013.01); *G11C 5/148* (2013.01); *G11C 7/22* (2013.01); *G11C 11/1675* (2013.01); *G11C 11/1697* (2013.01); *G11C 11/2275* (2013.01); *G11C 11/2297* (2013.01); *G11C 13/0038* (2013.01); *G11C 13/0069* (2013.01); *G06F 2212/452* (2013.01); *G11C 11/005* (2013.01)

(58) Field of Classification Search
None
See application file for complete search history.

(56) References Cited

U.S. PATENT DOCUMENTS

| | | | | |
|---|---|---|---|---|
| 7,453,715 B2 * | 11/2008 | Parkinson | ............... | G11C 7/062 |
| | | | | 365/148 |
| 8,520,442 B2 * | 8/2013 | Yoon | ..................... | G11C 16/26 |
| | | | | 365/185.18 |

(Continued)

*Primary Examiner* — Henry Tsai
*Assistant Examiner* — Christopher A Bartels
(74) *Attorney, Agent, or Firm* — William Park & Associates Ltd.

(57) ABSTRACT

An electronic device may include a semiconductor memory. The semiconductor memory may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on a coupling code signal.

19 Claims, 7 Drawing Sheets

(51) Int. Cl.
*G06F 13/42* (2006.01)
*G11C 11/00* (2006.01)

(56) References Cited

U.S. PATENT DOCUMENTS

| | | | | |
|---|---|---|---|---|
| 8,542,543 B2* | 9/2013 | Hwang | ................. | G11C 5/063 |
| | | | | 365/148 |
| 8,681,544 B2* | 3/2014 | Lee | .................... | G11C 11/5628 |
| | | | | 365/185.03 |
| 8,711,609 B2* | 4/2014 | Lee | .................... | G11C 11/1675 |
| | | | | 365/158 |
| 8,743,632 B2* | 6/2014 | Kim | ....................... | G11C 5/147 |
| | | | | 365/148 |
| 8,902,662 B2 | 12/2014 | Shiga et al. | | |
| 9,570,160 B1* | 2/2017 | Shah | ...................... | G11C 29/42 |
| 9,646,660 B2* | 5/2017 | Tanzawa | .................. | G11C 7/22 |
| 9,672,940 B1* | 6/2017 | Reusswig | .............. | G11C 16/10 |
| 9,711,227 B1* | 7/2017 | Ghai | ..................... | G06F 3/0619 |
| 2004/0174732 A1* | 9/2004 | Morimoto | ........... | G11C 11/5685 |
| | | | | 365/148 |
| 2009/0141532 A1* | 6/2009 | Nagashima | .............. | G11C 5/02 |
| | | | | 365/51 |
| 2009/0168493 A1* | 7/2009 | Kim | ......................... | G11C 5/02 |
| | | | | 365/148 |
| 2010/0118595 A1* | 5/2010 | Bae | ........................ | G11C 5/145 |
| | | | | 365/148 |
| 2015/0364188 A1* | 12/2015 | Lee | ...................... | G11C 13/004 |
| | | | | 365/148 |
| 2016/0027485 A1* | 1/2016 | Park | ...................... | G11C 29/021 |
| | | | | 365/191 |
| 2016/0217869 A1* | 7/2016 | Tseng | ................. | G11C 16/3459 |
| 2016/0314844 A1* | 10/2016 | Dutta | ..................... | G11C 16/10 |
| 2017/0200501 A1* | 7/2017 | Yang | .................. | G11C 16/0483 |
| 2017/0206961 A1* | 7/2017 | Yoon | ........................ | G06F 3/061 |
| 2017/0256320 A1* | 9/2017 | Lang | ..................... | G11C 16/26 |

\* cited by examiner

ELECTRONIC DEVICE AND METHOD OF DRIVING THE SAME

CROSS-REFERENCE TO RELATED APPLICATIONS

The present application claims priority of Korean Patent Application No. 10-2015-0182846, entitled "ELECTRONIC DEVICE" and filed on Dec. 21, 2015, which is incorporated herein by reference in its entirety.

BACKGROUND

1. Technical Field

This patent document relates to memory circuits or devices and their applications in electronic devices or system.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which performance of a write operation is improved.

In one aspect, an electronic device includes a semiconductor memory that includes: a write circuit block suitable for generating a write current corresponding to a write data based on a control code signal; a first selection block suitable for coupling the write circuit block to a first line based on a first selection signal and transmitting a cell current corresponding to the write current to the first line; a memory cell coupled between the first line and a second line, and suitable for storing the write data based on the cell current; a coupling circuit block suitable for selectively coupling one or more voltage terminals among a plurality of voltage terminals to the second line based on a coupling code signal; and a coupling control circuit block suitable for generating the coupling code signal corresponding to the write current based on the control code signal.

Implementations of the above electronic device may include one or more the following.

The write circuit block and the first selection block may operate in a first voltage domain. The coupling circuit block may operate in a second voltage domain. The second voltage domain may be lower than the first voltage domain. The first voltage domain may include a voltage range between a ground voltage and a positive voltage, and the second voltage domain may include a voltage range between a negative voltage and the ground voltage. The coupling control circuit block may generate first and second coupling signals as the coupling code signal. The coupling circuit block may include: a first coupling unit suitable for coupling a first voltage terminal to the memory cell based on the first coupling signal; and a second coupling unit suitable for coupling a second voltage terminal to the memory cell based on the second coupling signal. A negative voltage may be supplied to the first voltage terminal, and a voltage between the negative voltage and a ground voltage may be supplied to the second voltage terminal. The write circuit block may be coupled to a third voltage terminal where a positive voltage is supplied. The coupling control circuit block may enable the first coupling signal or selectively enable the first and second coupling signals based on a current amount of the write current. The semiconductor memory may further include: a current control circuit block suitable for generating the control code signal based on a reset enable signal corresponding to the write data of a first logic state and a set enable signal corresponding to the write data of a second logic state; and a second selection block suitable for coupling the second line to the coupling circuit block based on a second selection signal.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In one aspect, a method for driving an electronic device including a semiconductor memory includes: selecting first and second lines coupled to both sides of a memory cell to store a write data; and supplying a write current generated based on a control code signal corresponding to the write data to the first line and selectively coupling at least one among first and second voltage terminals to the second line based on a coupling code signal corresponding to the write current.

Implementations of the above method may include one or more of the following.

The selecting of the first and second lines may include selecting the first line based on a first selection block which operates in a first voltage domain and selecting the second line based on a second selection block which operates in a second voltage domain. The first voltage domain may be higher than the second voltage domain. The selectively coupling of at least one among a plurality of voltage terminals to the second line may include coupling the first voltage terminal to the second line when the write current corresponds to the write data of a first logic state and selectively coupling the first and second voltage terminals to the second line when the write current corresponds to the write data of a second logic state.

These and other aspects, implementations and associated advantages are described in greater detail in the drawings, the description and the claims.

DETAILED DESCRIPTION

Figure 1:
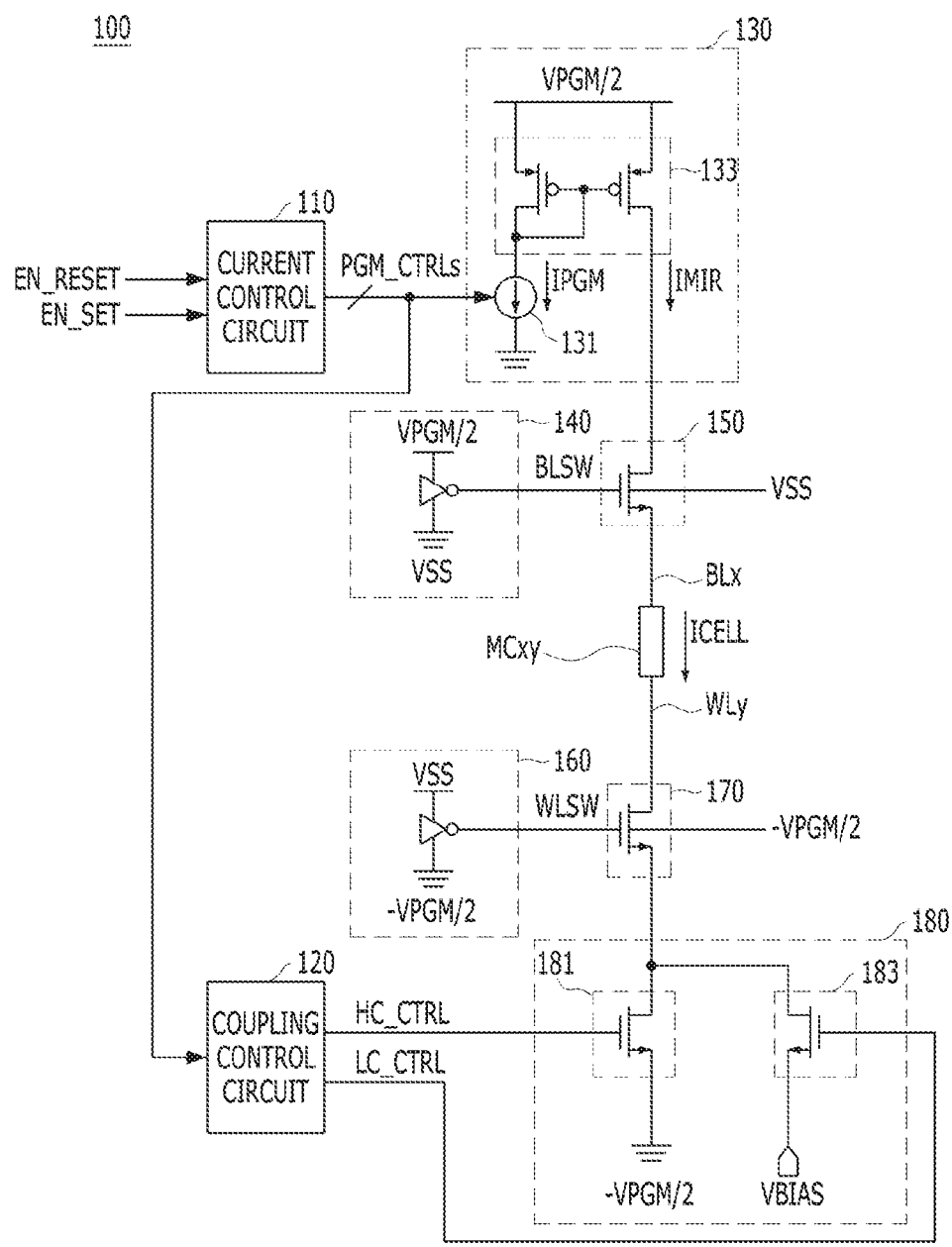
FIG. 1 is a cross-sectional view illustrating an example of a memory device in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single layer or a multi layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

Moreover, the variable resistance element may include a phase change material. The phase change material may include a chalcogenide material such as germanium-antimony-tellurium (GST: GeSbTe). The variable resistance element switches between different resistance states by changing a crystal state or an amorphous state using a heat.

Also, the variable resistance element may include a structure having a tunnel barrier interposed between two magnetic layers. The magnetic barrier may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

FIG. 1 is a cross-sectional view illustrating a memory device in accordance with an implementation of the present disclosure.

Referring to FIG. 1, a memory device 100 may include a current control circuit 110, a coupling control circuit 120, a write circuit 130, a column decoding circuit 140, a column selection circuit 150, a memory cell MCxy, a row decoding circuit 160, a row selection circuit 170, and a coupling circuit 180.

The current control circuit 110 may generate a control code signal PGM_CTRL based on a reset enable signal EN_RESET corresponding to write data of a first logic state (hereinafter referred to as a "first write data") and a set enable signal EN_SET corresponding to write data of a second logic state (hereinafter referred to as a "second write data"). For example, when the first write data is written in the memory cell MCxy, in response to the reset enable signal EN_RESET, the current control circuit 110 may generate the control code signal PGM_CTRL corresponding to the first write data. When the second write data is written in the memory cell MCxy, in response to the set enable signal EN_SET, the current control circuit 110 may generate the control code signal PGM_CTRL corresponding to the second write data.

The coupling control circuit 120 may generate coupling code signals HC_CTRL and LC_CTRL based on the control code signal PGM_CTRL. The coupling code signals HC_CTRL and LC_CTRL may include a first coupling signal HC_CTRL and a second coupling signal LC_CTRL. Each coupling code signal HC_CTRL or LC_CTRL may have a one-to-one correspondence to one of various levels of write current IPGM. For example, when the write current IPGM corresponds to the first write data, the coupling control circuit 120 may enable the first coupling signal HC_CTRL. When the write current IPGM corresponds to the second write data, the coupling control circuit 120 may selectively enable at least one of the first coupling signal HC_CTRL and the second coupling signal LC_CTRL. In other words, the coupling control circuit 120 may distinguish the levels of the write current IPGM based on the control code signal PGM_CTRL, which is generated in response to the reset enable signal EN_RESET and the set enable signal EN_SET, and may enable the first coupling signal HC_CTRL or sequentially enable the first coupling signal HC_CTRL and the second coupling signal LC_CTRL based on the levels of the write current IPGM and a predetermined reference current IREF.

The write circuit 130 may generate the write current IPGM based on the control code signal PGM_CTRL. For example, the write circuit 130 may include a write current generation circuit 131 and a mirroring circuit 133. The write current generation circuit 131 may generate the write current IPGM based on the control code signal PGM_CTRL. For example, the write current generation circuit 131 may generate the write current IPGM corresponding to the first write data based on the control code signal PGM_CTRL corresponding to the first write data. The write current IPGM corresponding to the first write data may be larger than the reference current IREF and may be referred to as a reset current. The write current generation circuit 131 may generate the write current IPGM corresponding to the second write data based on the control code signal PGM_CTRL corresponding to the second write data. The write current IPGM corresponding to the second write data may be smaller than the reference current IREF and may be referred to as a set current. For example, the write current generation circuit 131 may be coupled between the mirroring circuit 133 and a terminal of a ground voltage VSS and may include a current digital-to-analog converter IDAC. The mirroring circuit 133 may mirror the write current IPGM to generate a mirroring current IMIR. For example, the mirroring circuit 133 may include a first PMOS transistor coupled between the write current generation circuit 131 and a terminal of a positive voltage VPGM/2 and having a gate coupled to a drain of the first PMOS transistor. The mirroring circuit 133 may also include a second PMOS transistor coupled between the column selection circuit 150 and the positive voltage VPGM/2 terminal and having a common gate coupled to the gate of the first PMOS transistor.

The column decoding circuit 140 may generate a column selection signal BLSW. For example, the column selection signal BLSW may be a signal that swings between a positive voltage VPGM/2 and a ground voltage VSS.

The column selection circuit 150 may couple a bit line BLx to the write circuit 130 based on the column selection signal BLSW. The column selection circuit 150 may transmit cell current ICELL corresponding to the mirroring current IMIR to the bit line BLx. For example, the column selection circuit 150 may include an NMOS transistor coupled between the write circuit 130 and the bit line BLx, a gate receiving the column selection signal BLSW, and a bulk coupled to the terminal of the ground voltage VSS.

The memory cell MCxy may be coupled between the bit line BLx and a word line WLy. The memory cell MCxy may store the first write data or the second write data based on the cell current ICELL. For example, the memory cell MCxy may include a variable resistance element (not illustrated) and a selection element (not illustrated) coupled between the bit line BLx and the word line WLy in series. The variable resistance element may include the phase change material. In this case, the variable resistance element may store the first write data by allowing the cell current ICELL corresponding to the reset current and changing a phase of the variable resistance element. In other words, the variable resistance element may have a high resistance state corresponding to an amorphous state. The variable resistance element may store the second write data by allowing the cell current ICELL corresponding to the set current to flow though the variable resistance element and thus changing a phase of the variable resistance element. In other words, the variable resistance element may have a low resistance state corresponding to a crystal state. The selection element may perform a switching operation based on the cell current ICELL. For example, the selection element may include an ovonic threshold switch (OTS).

The row decoding circuit 160 may generate a row selection signal WLSW. For example, the row selection signal WLSW may be a signal that swings between the ground voltage VSS and a negative voltage −VPGM/2.

The row selection circuit 170 may couple the word line WLy to the coupling circuit 180 in response to the row selection signal WLSW. The row selection circuit 170 may transmit the cell current ICELL to the word line WLy. For example, the row selection circuit 170 may include an NMOS transistor coupled between the word line WLy and the coupling circuit 180 and having a gate receiving the row selection signal WLSW and a bulk coupled to a terminal of a negative voltage −VPGM/2.

The coupling circuit 180 may couple the word line WLy to the terminal of the negative voltage −VPGM/2 in response to the first coupling signal HC_CTRL and couple the word line WLy to a predetermined voltage VBIAS terminal in response to the second coupling signal LC_CTRL. For example, the coupling circuit 180 may include a first NMOS transistor 181 coupled between the row selection circuit 170 and the negative voltage −VPGM/2 terminal and a gate receiving the first coupling signal HC_CTRL. The coupling circuit 180 may also include a second NMOS transistor 183 having a drain and a source coupled between the row selection circuit 170 and a terminal of the predetermined voltage VBIAS and a gate receiving the second coupling signal LC_CTRL. A predetermined voltage VBIAS may include a voltage ranging between the negative voltage −VPGM/2 and the ground voltage VSS.

The circuits 130, 140 and 150 may operate in a first voltage domain, and the circuits 160, 170 and 180 may operate in a second voltage domain that is lower than the first voltage domain. For example, the first voltage domain may include a voltage range between the ground voltage VSS and the positive voltage VPGM/2, and the second voltage domain may include a voltage range between the negative voltage −VPGM/2 and the ground voltage VSS.

Hereinafter, an operation of the memory device 100 having the aforementioned structure is described with reference to FIGS. 2 to 3D.

Figure 2:
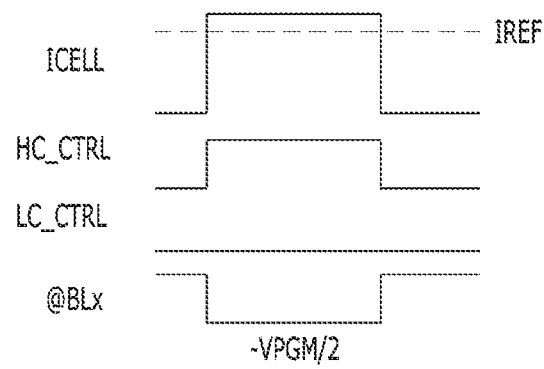
FIGS. 2 to 3D are timing diagrams illustrating example timing waveforms for an operation of a memory device.

FIG. 2 is a timing diagram illustrating example timing waveforms for a process of storing the first write data in a method of driving the memory device 100.

Referring to FIG. 2, the memory device 100 may select the bit line BLx and the word line WLy coupled to both sides of the memory cell MCxy that may store the first write data. For example, when the column selection signal BLSW is enabled and output from the column decoding circuit 140, the column selection circuit 150 may couple the bit line BLx to the write circuit 130. When the row selection signal WLSW is enabled and output from the row decoding circuit 160, the row selection circuit 170 may couple the word line WLy to the coupling circuit 180.

In response to the reset enable signal EN_RESET enabled, the current control circuit 110 may generate the control code signal PGM_CTRL corresponding to the first write data.

The write circuit 130 may generate the write current IPGM corresponding to the first write data based on the control code signal PGM_CTRL and generate the mirroring current IMIR by mirroring the write current IPGM.

The coupling control circuit 120 may enable the first coupling signal HC_CTRL based on the control code signal PGM_CTRL. For example, the coupling control circuit 120 may indirectly distinguish between the write current IPGM corresponds to the first write data and the write current IPGM corresponds to the second write data based on the control code signal PGM_CTRL. In an example, the coupling control circuit 120 may selectively generate the first coupling signal HC_CTRL and the second coupling signal LC_CTRL based on the comparison between the write current IPGM and the predetermined reference current IREF. For example, the coupling control circuit 120 may enable the first coupling signal HC_CTRL if the write current IPGM is larger than the reference current IREF. The coupling circuit 180 may couple the negative voltage −VPGM/2 terminal to the row selection circuit 170 based on the first coupling signal HC_CTRL.

Consequently, the column selection circuit 150 may transmit the mirroring current IMIR generated from the write circuit 130 to the memory cell MCxy as the cell current ICELL, and the memory cell MCxy may store the first write data based on the cell current ICELL. For example, the memory cell MCxy may change into a high-resistance state based on the reset current.

Figure 3A:
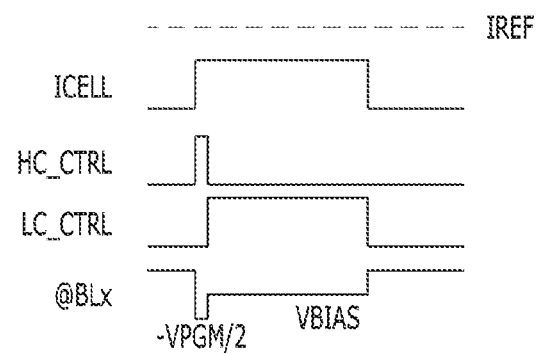

FIG. 3A is a timing diagram illustrating example timing waveforms for a process of storing the second write data in the method of driving the memory device 100.

Referring to FIG. 3A, the memory device 100 may select the bit line BLx and the word line WLy coupled to the memory cell MCxy that may store the second write data. For example, when the column selection signal BLSW is enabled and output from the column decoding circuit 140, the column selection circuit 150 may couple the bit line BLx to the write circuit 130. When the row selection signal WLSW is enabled and output from the row decoding circuit 160, the row selection circuit 170 may couple the word line WLy to the coupling circuit 180.

In response to the set enable signal EN_SET is enabled, the current control circuit 110 may generate the control code signal PGM_CTRL corresponding to the second write data.

The write circuit 130 may generate the write current IPGM corresponding to the second write data based on the control code signal PGM_CTRL and generate the mirroring current IMIR by mirroring the write current IPGM.

The coupling control circuit 120 may selectively enable the first coupling signal HC_CTRL and the second coupling signal LC_CTRL based on the control code signal PGM_CTRL. For example, the coupling control circuit 120 may indirectly distinguish between the write current IPGM corresponds to the first write data and the write current IPGM corresponds to the second write data based on the control code signal PGM_CTRL. In an example, the coupling control circuit 120 may selectively generate the first coupling signal HC_CTRL and the second coupling signal LC_CTRL based on the comparison between the write current IPGM and the predetermined reference current IREF. For example, the coupling control circuit 120 may enable the first coupling signal HC_CTRL and maintain a logic level thereof during a certain period, and then may enable the second coupling signal LC_CTRL when the first coupling signal HC_CTRL becomes disabled if the write current IPGM is smaller than the reference current IREF. As a result, the coupling circuit 180 may couple the terminal of the negative voltage −VPGM/2 to the row selection circuit 170 based on the first coupling signal HC_CTRL enabled, and then may couple the predetermined voltage VBIAS terminal to the row selection circuit 170 based on the second coupling signal LC_CTRL enabled.

Consequently, the column selection circuit 150 may transmit the mirroring current IMIR generated from the write circuit 130 to the memory cell MCxy as the cell current ICELL, and the memory cell MCxy may store the second write data based on the cell current ICELL. For example, the memory cell MCxy may change into a low-resistance state based on the set current.

The positive voltage VPGM/2 and the negative voltage −VPGM/2 may be applied to the both sides of the memory cell MCxy by the coupling circuit 180 during an initial period. In other words, a high voltage difference VPGM may occur on the both sides of the memory cell MCxy during the initial period. The initial period may include a period during which the memory cell MCxy may be changed to the low-resistance state.

The positive voltage VPGM/2 and the predetermined voltage VBIAS may be applied to the both sides of the memory cell MCxy by the coupling circuit 180 during the period after the initial period. The reason why the predetermined voltage VBIAS is applied to one side of the memory cell MCxy during the period after the initial period is as follows. If the negative voltage −VPGM/2 is continuously applied even during the period after the initial period during which the memory cell MCxy has been changed to the low resistance state, the negative voltage −VPGM/2 continuously applied to the bit line BLx may cause a gate-source voltage Vgs of the NMOS transistor included in the column selection circuit 150 to become excessive compared to an allowable voltage VPGM/2. Thus, a leakage current due to a PN junction may flow in a direction to a bit line BLx in the bulk of the NMOS transistor. Consequently, an unintended current may flow since the cell current ICELL and the leakage current are combined in the bit line BLx. Therefore, as the voltage VBIAS having a higher level than the negative voltage −VPGM/2 is applied to one side of the memory cell MCxy during the period after the initial period, the inflow of the leakage current may be minimized.

Figure 3B:
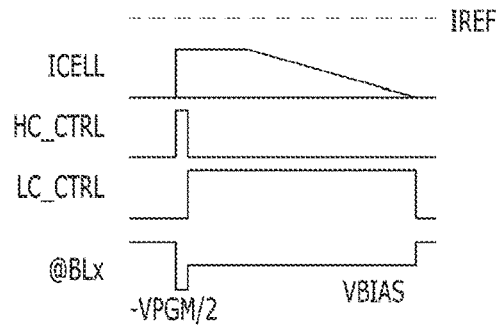
Figure 3C:
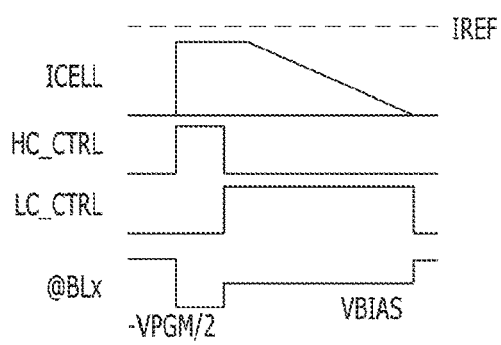
Figure 3D:
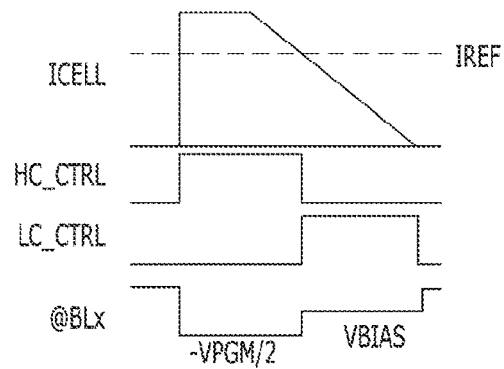

FIGS. 3B to 3D are timing diagrams illustrating example timing waveforms for a process of storing the second write data in the method of driving the memory device 100. In other words, FIGS. 3B to 3D are timing diagrams illustrating example timing waveforms for the process of storing the second write data based on the cell current ICELL having a slow quenching slope.

The process of FIGS. 3B to 3D may be quite similar to the process of FIG. 3A. However, the coupling control circuit 120 has to be set to properly control enabling timing of the first and second coupling signals HC_CTRL and LC_CTRL based on an initial level of the cell current ICELL. For example, as illustrated in FIG. 3B, when the initial level of the cell current ICELL is set to be far lower than the reference current IREF, the first coupling signal HC_CTRL may be set to be enabled during a first initial period, and the second coupling signal LC_CTRL may be set to be enabled during a period after the first initial period. As illustrated in FIG. 3C, when the initial level of the cell current ICELL is set to be slightly lower than the reference current IREF, the first coupling signal HC_CTRL may be set to be enabled during a second initial period, and the second coupling signal LC_CTRL may be set to be enabled during a period after the second initial period. The second initial period may be longer than the first initial period. As illustrated in FIG. 3D, when the initial level of the cell current ICELL is set to be higher than the reference current IREF, the first coupling signal HC_CTRL may be set to be enabled during a period where the cell current ICELL is higher than the reference current IREF, and the second coupling signal LC_CTRL may be set to be enabled during a period where the cell current ICELL is lower than the reference current IREF.

As described above, by minimizing leakage current that may flow in through a PN junction when the memory cell is in a "set" state, operational characteristics of a semiconductor memory may be improved.

In addition, the semiconductor memory in accordance with an embodiment may also improve operational characteristics of an electronic device including the semiconductor memory and a method of driving the electronic device.

The above and other memory circuits or semiconductor devices based on the disclosed technology may be used in a range of devices or systems. FIGS. 4-8 provide some examples of devices or systems that may implement the memory circuits disclosed herein.

Figure 4:
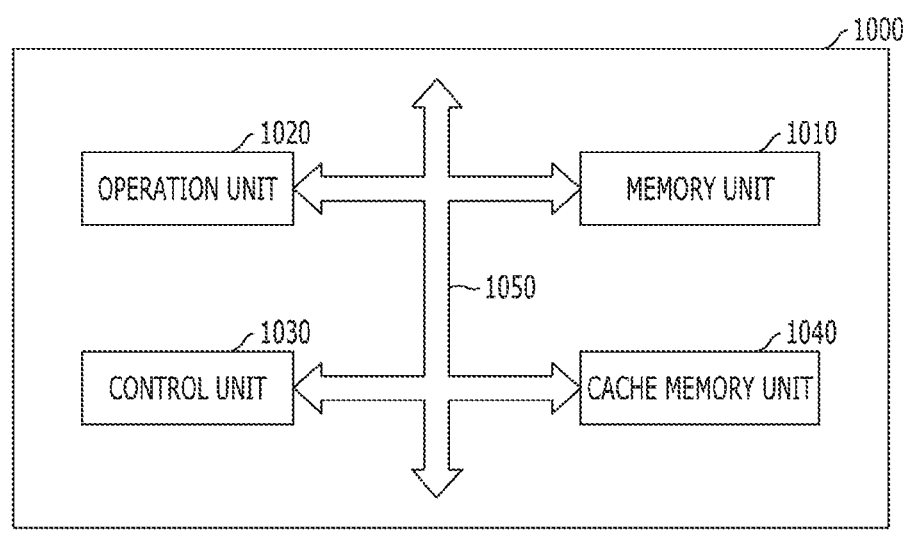
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on the coupling code signal. The use of the memory unit 1010 in accordance with various embodiments may lead to performance improvements of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
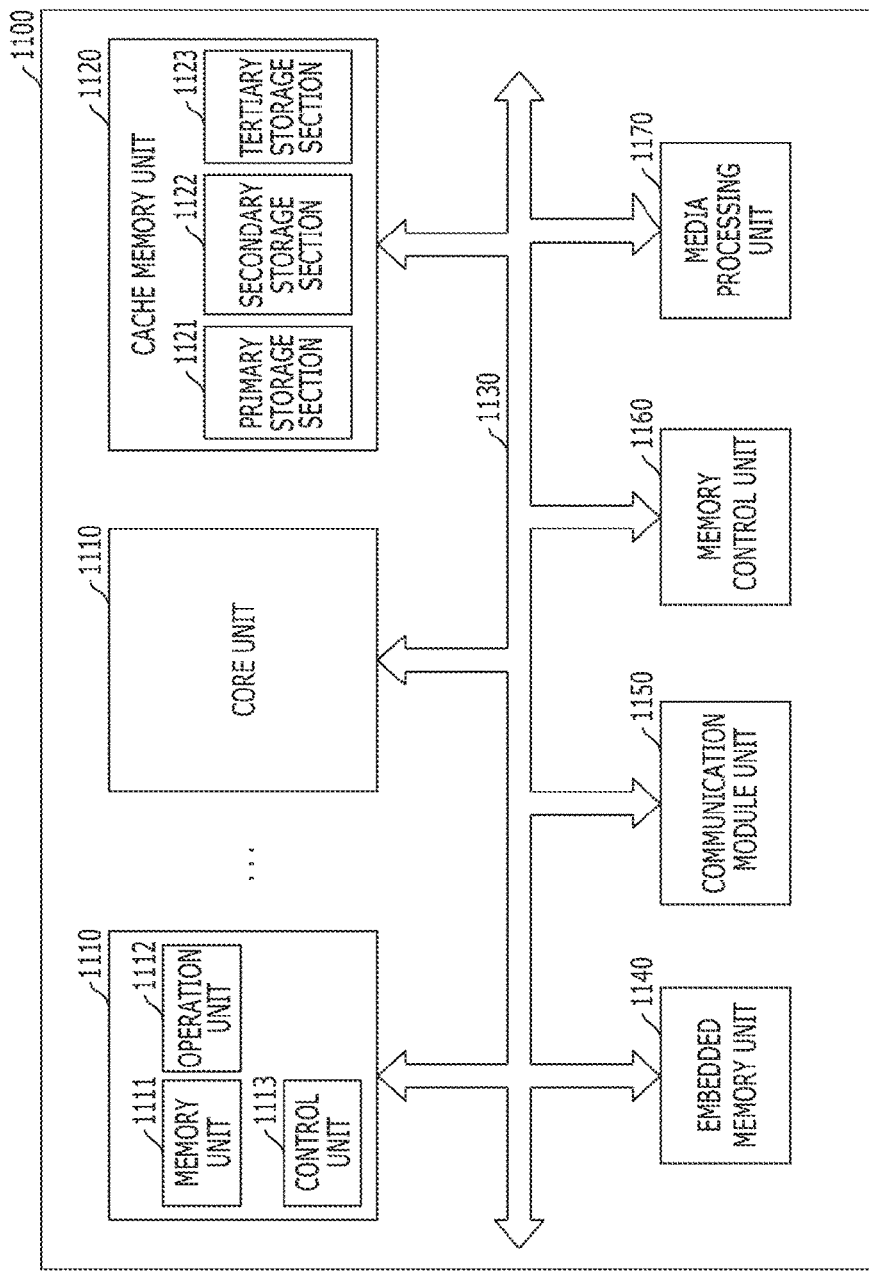
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on the coupling code signal. The use of the cache memory unit 1120 in accordance with various embodiments may lead to performance improvements of the processor 1100.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
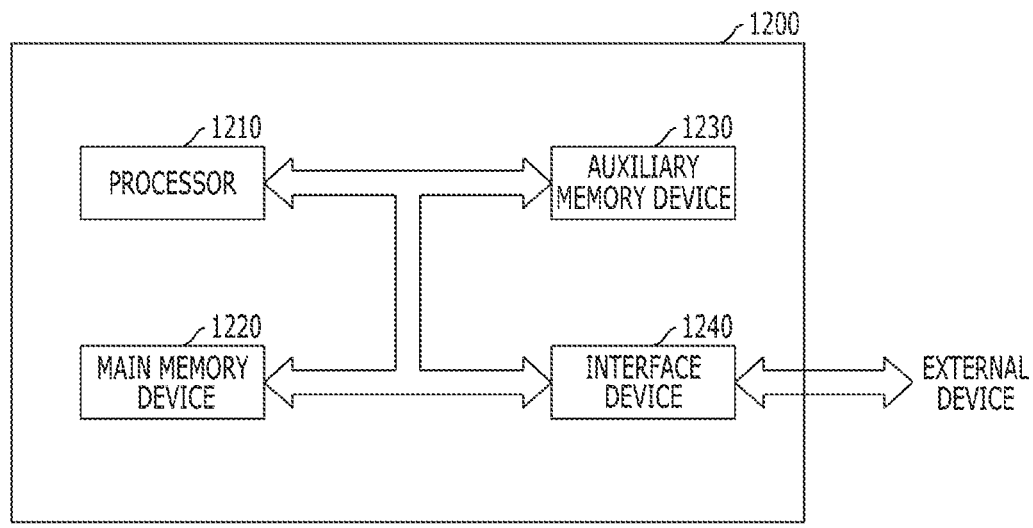
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on the coupling code signal. The use of the main memory device 1220 in accordance with various embodiments may lead to performance improvements of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on the coupling code signal. The use of the auxiliary memory device 1230 in accordance with various embodiments may lead to performance improvements of the system 1200.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
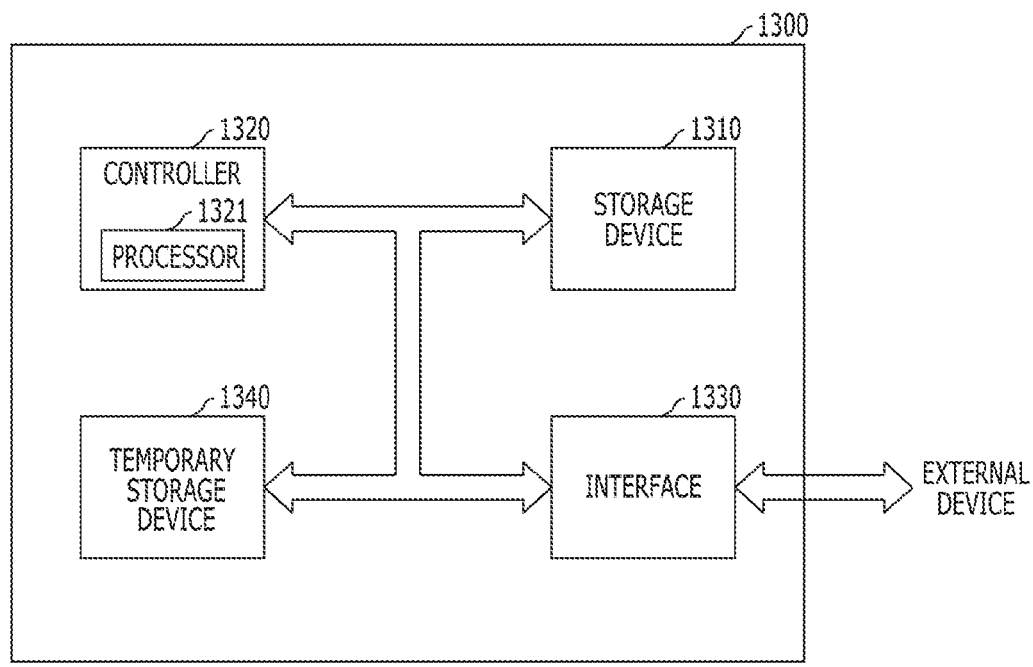
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on a coupling code signal. The use of the temporary storage device 1340 in accordance with various embodiments may lead to performance improvements of the system 1300.

Figure 8:
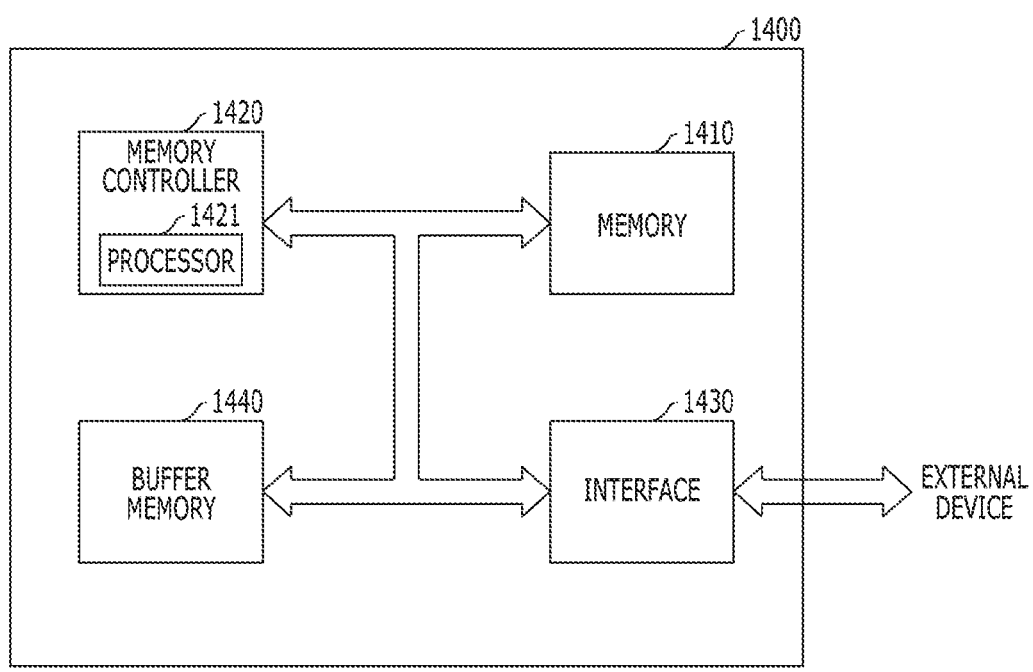
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on a coupling code signal. The use of the memory 1410 in accordance with various embodiments may lead to performance improvements of the microprocessor 1400.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a write circuit, a first selection circuit, a memory cell, a coupling control circuit, and a coupling circuit. The write circuit may generate a write current corresponding to write data based on a control code signal. The first selection circuit may couple the write circuit to a first line based on a first selection signal, and may allow cell current corresponding to the write current to flow to the first line. The memory cell may be coupled between the first line and a second line, and may store the write data based on the cell current. The coupling control circuit may generate a coupling code signal corresponding to the write current based on the control code signal. The coupling circuit may selectively couple one or more voltage terminals among a plurality of voltage terminals to the second line based on a coupling code signal. The use of the buffer memory 1440 in accordance with various embodiments may lead to performance improvements of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device, comprising a semiconductor memory that includes:
   a write circuit suitable for generating a write current corresponding to write data during a write period, based on a control code signal;
   a first selection circuit suitable for coupling the write circuit to a first line based on a first selection signal and allowing cell current corresponding to the write current to flow to the first line;
   a memory cell coupled between the first line and a second line, and changed to any one of first and second resistance states based on the cell current;
   a coupling control circuit suitable for generating first and second coupling signals corresponding to the write current based on the control code signal; and
   a coupling circuit suitable for coupling a first voltage terminal to the second line during an initial period of the write period and coupling a second voltage terminal to the second line during a period after the initial period of the write period, based on the first and second coupling signals when the memory cell is changed to the first resistance state,
   wherein the coupling circuit couples the first voltage terminal to the second line during the write period, based on the first and second coupling signals when the memory cell is changed to the second resistance state.

2. The electronic device according to claim 1, wherein the write circuit and the first selection circuit operate in a first voltage domain.

3. The electronic device according to claim 2, wherein the coupling circuit operates in a second voltage domain.

4. The electronic device according to claim 3, wherein the second voltage domain is lower than the first voltage domain.

5. The electronic device according to claim 4, wherein the first voltage domain includes a voltage range between a ground voltage and a positive voltage, and the second voltage domain includes a voltage range between a negative voltage and the ground voltage.

6. The electronic device according to claim 1, wherein the coupling circuit includes:
   a first coupling circuit suitable for coupling the first voltage terminal to the second line based on the first coupling signal; and
   a second coupling circuit suitable for coupling the second voltage terminal to the second line based on the second coupling signal.

7. The electronic device according to claim 1, wherein a negative voltage is applied to the first voltage terminal, and a voltage between the negative voltage and a ground voltage is applied to the second voltage terminal.

8. The electronic device according to claim 7, wherein the write circuit is coupled to a third voltage terminal where a positive voltage is applied.

9. The electronic device according to claim 1, wherein the coupling control circuit enables the first coupling signal or selectively enables the first and second coupling signals based on an amount of the write current.

10. The electronic device according to claim 1, wherein the semiconductor memory further includes:
    a current control circuit suitable for generating the control code signal based on a reset enable signal corresponding to the write data of a first logic state and a set enable signal corresponding to the write data of a second logic state; and
    a second selection circuit suitable for coupling the second line to the coupling circuit based on a second selection signal.

11. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

12. The electronic device of claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory that is part of the cache memory unit in the processor.

13. The electronic device of claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

14. The electronic device of claim 1, further comprising a data storage system which includes:
 a storage device configured to store data and conserve stored data regardless of power supply;
 a controller configured to control input and output of data to and from the storage device according to a command inputted form an outside;
 a temporary storage device configured to temporarily store data exchanged between the storage device and the outside; and
 an interface configured to perform communication between at least one of the storage device, the controller and the temporary storage device and the outside,
 wherein the semiconductor memory is part of the storage device or the temporary storage device in the data storage system.

15. The electronic device of claim 1, further comprising a memory system which includes:
 a memory configured to store data and conserve stored data regardless of power supply;
 a memory controller configured to control input and output of data to and from the memory according to a command inputted form an outside;
 a buffer memory configured to buffer data exchanged between the memory and the outside; and
 an interface configured to perform communication between at least one of the memory, the memory controller and the buffer memory and the outside,
wherein the semiconductor memory is part of the memory or the buffer memory in the memory system.

16. A method of driving an electronic device including a semiconductor memory, comprising:
 selecting first and second lines coupled to both sides of a memory cell to store write data of a first logic state;
 providing a first write current generated based on a control code signal corresponding to the write data of the first logic state to the first line during a first write period; and
 coupling a first voltage terminal to the second line, based on a coupling circuit, during an initial period of the first write period and coupling a second voltage terminal to the second line during a period after the initial period of the first write period, based on first and second coupling signals corresponding to the first write current when the memory cell is changed to a first resistance state of first and second resistance states,
 wherein the coupling circuit couples the first voltage terminal to the second line during the write period, based on the first and second coupling signals when the memory cell is changed to the second resistance state.

17. The method according to claim 16, wherein selecting the first and second lines includes selecting the first line by a first selection circuit which operates in a first voltage domain and selecting the second line by a second selection circuit which operates in a second voltage domain.

18. The method according to claim 17, wherein the first voltage domain is higher than the second voltage domain.

19. The method according to claim 16 further comprising:
selecting third and fourth lines coupled to both sides of a memory cell to store write data of a second logic state;
 providing a second write current generated based on the control code signal corresponding to the write data of the second logic state to the third line during a second write period; and
 coupling the first voltage terminal to the fourth line during the second write period, based on the first and second coupling signals corresponding to the second write current when the memory cell is changed to the second resistance state.

* * * * *